United States Patent [19]
Yoo et al.

[11] Patent Number: 6,064,601
[45] Date of Patent: May 16, 2000

[54] INTEGRATED CIRCUIT MEMORY DEVICES AND CONTROLLING METHODS THAT SIMULTANEOUSLY ACTIVATE MULTIPLE COLUMN SELECT LINES DURING A WRITE CYCLE OF A PARALLEL BIT TEST MODE

[75] Inventors: Jei-hwan Yoo; Byung-chul Kim, both of Kyungki-do, Rep. of Korea

[73] Assignee: Samsung Electronics Co., Ltd., Rep. of Korea

[21] Appl. No.: 09/104,475

[22] Filed: Jun. 25, 1998

[30] Foreign Application Priority Data

Dec. 29, 1997 [KR] Rep. of Korea ............... 97-76391

[51] Int. Cl.[7] .................................................. G11C 16/04
[52] U.S. Cl. ........................ 365/189.04; 365/189.05; 365/201
[58] Field of Search ........................... 365/201, 189.04, 365/189.05

[56] References Cited

U.S. PATENT DOCUMENTS

| | | | |
|---|---|---|---|
| 5,202,853 | 4/1993 | Choi | 365/201 |
| 5,301,142 | 4/1994 | Suzuki et al. | 365/51 |
| 5,416,741 | 5/1995 | Ohsawa | 365/201 |
| 5,568,434 | 10/1996 | Jeon | 365/201 |
| 5,748,641 | 5/1998 | Ohsawa | 371/21.3 |
| 5,809,225 | 9/1998 | Ohsawa et al. | 395/183.08 |

*Primary Examiner*—David Nelms
*Assistant Examiner*—Gene N. Auduong
*Attorney, Agent, or Firm*—Myers Bigel Sibley & Sajovec

[57] ABSTRACT

Integrated circuit memory devices can reduce write time during a write cycle of a parallel bit test mode. The memory devices include a simultaneous column select line activation circuit that simultaneously activates at least two of the plurality of column select lines during a write cycle of a parallel bit test mode. Therefore, during the write cycle, at least two bit lines are simultaneously connected to one input and output line since at least two column select lines are simultaneously activated by the simultaneous column select line activation circuit. Accordingly, data is simultaneously written to the memory cells connected to at least two bit lines through the input and output line.

15 Claims, 5 Drawing Sheets

INTEGRATED CIRCUIT MEMORY DEVICES AND CONTROLLING METHODS THAT SIMULTANEOUSLY ACTIVATE MULTIPLE COLUMN SELECT LINES DURING A WRITE CYCLE OF A PARALLEL BIT TEST MODE

FIELD OF THE INVENTION

The present invention relates to integrated circuit memory devices, and more particularly to a parallel bit test of a semiconductor memory device.

BACKGROUND OF THE INVENTION

The memory cells in a highly integrated memory device may take a long time to test. Therefore, parallel bit testing methods have been developed for testing the memory cells by simultaneously writing data to and reading data from a plurality of memory cells. By simultaneously writing to and reading from multiple memory cells, test time can be reduced. See for example, U.S. Pat. No. 5,568,434 to Jeon entitled *"Multi-Bit Testing Circuit for Semiconductor Memory Device"*.

Referring to FIG. 1, a conventional memory device includes a memory cell array 101, input and output lines IO1/$\overline{\text{IO1}}$ through IOn/$\overline{\text{IOn}}$, data input and output lines DIO1/$\overline{\text{DIO1}}$ through DIOn/$\overline{\text{DIOn}}$, column select lines CSL11 through CSL1n and CSL21 through CSL2n, and a column decoder 103. The column select lines CSL11 through CSL1n and CSL21 through CSL2n connect the bit lines of the memory cell array 101 to the respective input and output lines.

In a parallel bit test mode, the input and output lines IO1/$\overline{\text{IO1}}$ through IOn/$\overline{\text{IOn}}$ are connected to the data input and output lines DIO1/$\overline{\text{DIO1}}$ through DIOn/$\overline{\text{DIOn}}$. Data is simultaneously written to and read from the memory cells through the input and output lines and the data input and output lines. For example, when there are 32 input and output lines and 32 data input and output lines, 32 bits of data may be simultaneously written to and read from the memory cells. The column select lines CSL11 through CSL1n and CSL21 through CSL2n are sequentially activated by the column decoder 103 during the read and write cycles of the parallel bit test mode.

Unfortunately, in a highly integrated memory device, excessive writing and reading time may still be used, even though the parallel bit test method is used. Accordingly, there continues to be a need to allow further reduction in testing time.

SUMMARY OF THE INVENTION

It is therefore an object of the present invention to allow further reduction in testing time during parallel bit testing of integrated circuit memory devices.

This and other objects are provided, according to the present invention, by simultaneously activating at least two of the plurality of column select lines during a write cycle of a parallel bit test mode. By simultaneously activating at least two of the plurality of column select lines, reduction of write time during the write cycle of the parallel bit test mode may be obtained.

More specifically, integrated circuit memory devices according to the invention include a memory cell array, a plurality of input and output lines, and a plurality of column select lines that connect bit lines of the memory cell array to the input and output lines. A simultaneous column select line activation circuit simultaneously activates at least two of the plurality of column select lines during a write cycle of a parallel bit test mode. In a preferred embodiment, the simultaneous column select line activation circuit includes a column select line activation control circuit that generates a control signal during the write cycle of the parallel bit test mode. An address buffer disregards at least one address bit in response to the control signal. Finally, a column decoder simultaneously activates at least two of the plurality of column select lines in response to the address buffer. The column select line activation control circuit preferably performs a logic combination of a test signal indicating the parallel bit test mode, a column address strobe signal, a write enable signal and a clock, to thereby generate the control signal.

Methods of controlling an integrated circuit memory device during a parallel bit test mode include the step of simultaneously activating at least two of the plurality of column select lines during a write cycle of a parallel bit test mode. The at least two column select lines are preferably simultaneously activated by generating a control signal during the write cycle of the parallel bit test mode, disregarding at least one address bit when the control signal is activated, and simultaneously activating at least two of the plurality of column select lines when the at least one of the address bits is disregarded. The control signal is preferably generated by logically combining the column address strobe signal, a write enable signal, a clock and a test signal indicating the parallel bit test mode. Accordingly, write cycle time can be further reduced in a parallel bit test mode, to thereby allow highly integrated memory devices to be tested more rapidly.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
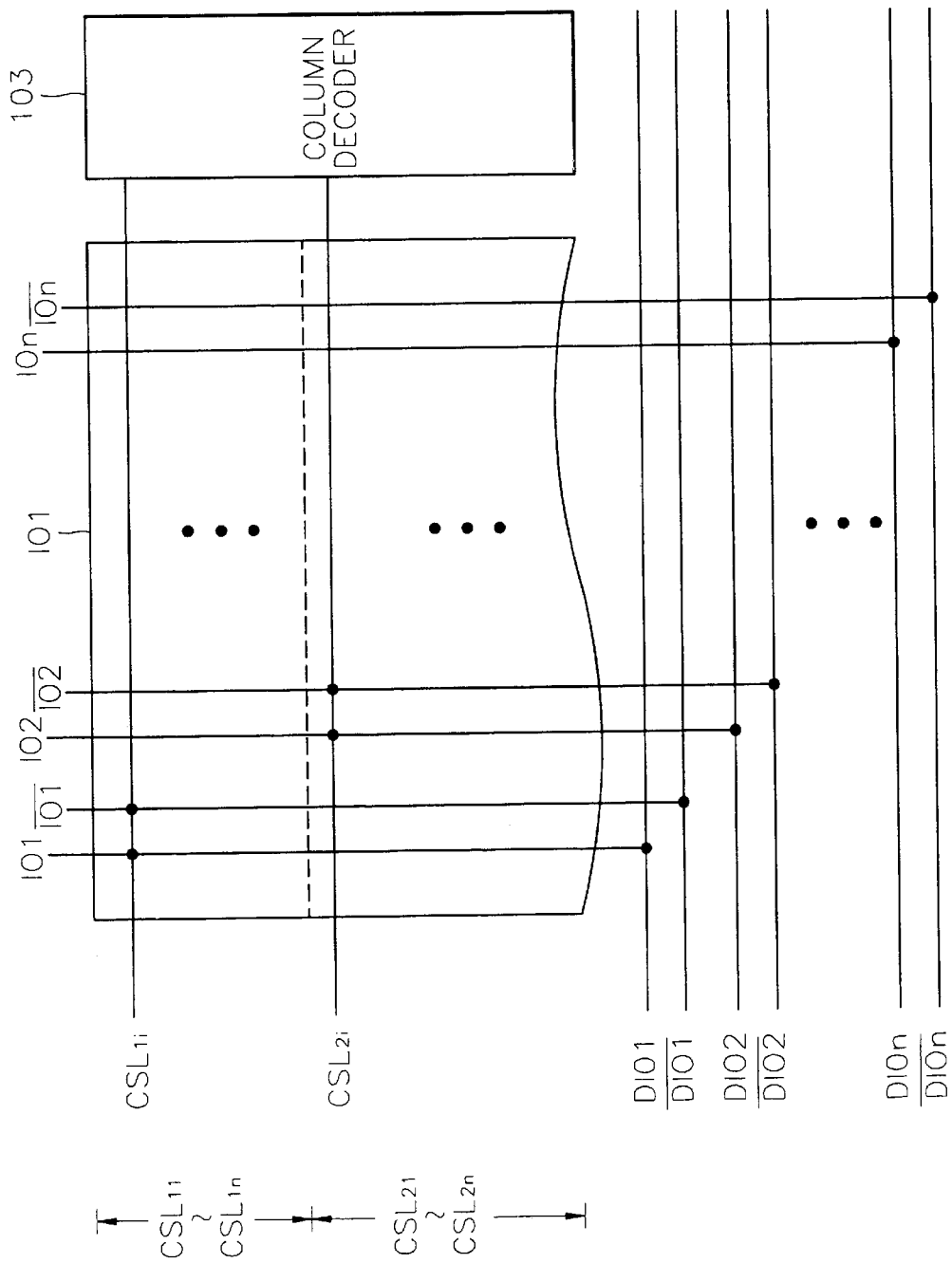
FIG. 1 is a schematic block diagram of a conventional integrated circuit memory device.
Figure 2:
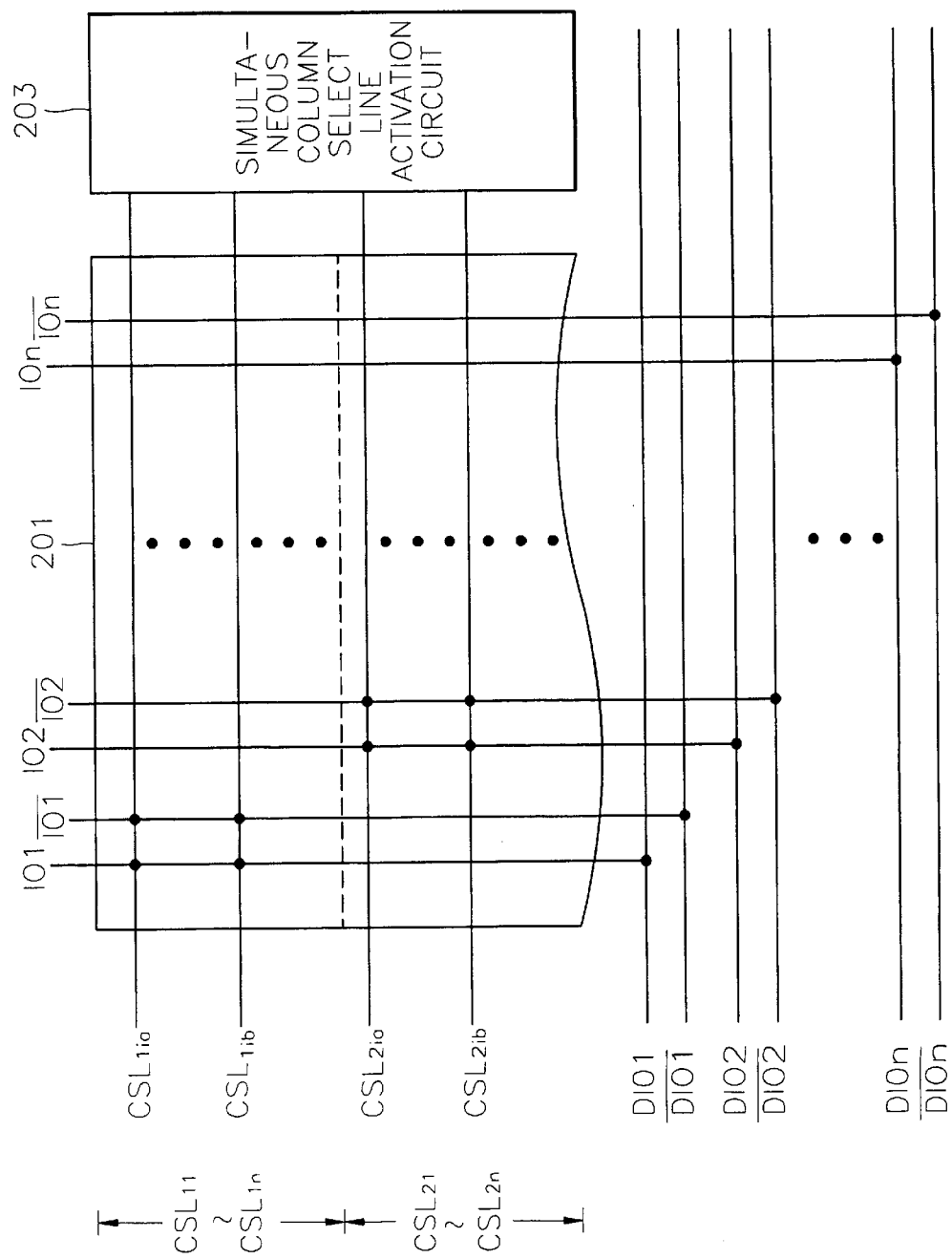
FIG. 2 is a schematic block diagram of integrated circuit memory devices according to the present invention.

Referring to FIG. 2, integrated circuit memory devices according to the present invention include a memory cell array 201, input and output lines IO1/$\overline{\text{IO1}}$ through IOn/$\overline{\text{IOn}}$, data input and output lines DIO1/$\overline{\text{DIO1}}$ through DIOn/$\overline{\text{DIOn}}$, column select lines CSL11 through CSL1n and CSL21 through CSL2n, and a simultaneous column select line activation circuit 203. The column select lines CSL11 through CSL1 n and CSL21 through CSL2n connect the bit lines (not shown) of the memory cell array 201 to the respective input and output lines. The simultaneous column select line activation circuit 203 simultaneously activates at least two of the column select lines during the write cycle of a parallel bit test mode. Writing time can therefore be reduced.

In detail, the input and output lines IO1/$\overline{\text{IO1}}$ through IOn/$\overline{\text{IOn}}$ are connected to the data input and output lines DIO1/$\overline{\text{DIO1}}$ through DIOn/$\overline{\text{DIOn}}$ during the read and write cycles of the parallel bit test mode. Therefore, during the read cycle of the parallel bit test mode, data is simultaneously read from the memory cells of the memory cell array 201 through the input and output lines and the data input and output lines. For example, when there are 32 input and output lines IO1/$\overline{\text{IO1}}$ through IOn/$\overline{\text{IOn}}$ and 32 data input and output lines DIO1/$\overline{\text{DIO10}}$ through DIOn/$\overline{\text{DIOn}}$, 32 bits of data may be simultaneously read from the memory cells.

During the read cycle of the parallel bit test mode, the column select lines CSL11 through CSL1n and CSL21 through CSL2n are sequentially activated by the simultaneous column select line activation circuit 203. For example, the column select lines CSL11 through CSL1n are sequentially activated, and thus the corresponding bit lines are sequentially connected to the input and output line IO1/$\overline{\text{IO1}}$. Therefore, the data of the memory cells connected to the corresponding bit lines is sequentially read through the input and output line IO1/$\overline{\text{IO1}}$ and the data input and output lines DIO1/$\overline{\text{DIO1}}$. The data of the memory cells is sequentially read through the input and output lines IO2/$\overline{\text{IO2}}$ through IOn/$\overline{\text{IOn}}$ and the data input and output lines DIO2/$\overline{\text{DIO2}}$ through DIOn/$\overline{\text{DIOn}}$ by the same operation.

In contrast, during the write cycle of the parallel bit test mode, at least two of the column select lines CSL11 through CSL1 n and CSL21 through CSL2n are activated by the simultaneous column select line activation circuit 203. Namely, when two column select lines CSL1ia and CSL1ib are simultaneously activated as shown in FIG. 2, two bit lines are connected to the input and output lines IO1/$\overline{\text{IO1}}$ through IOn/$\overline{\text{IOn}}$. Therefore, the same data is simultaneously written to the memory cells connected to the two corresponding bit lines through the data input and output line DIO1/$\overline{\text{DIO1}}$ and the input and output line IO1/$\overline{\text{IO1}}$. Also, the data is simultaneously written to two bit lines through the data input and output lines DIO2/$\overline{\text{DIO2}}$ through DIOn/$\overline{\text{DIOn}}$ and the input and output lines IO2/$\overline{\text{IO2}}$ through IOn/$\overline{\text{IOn}}$.

Therefore, in memory devices according to the present invention, the write time can be reduced to half or less of conventional technology since at least two column select lines are simultaneously activated during the write cycle of the parallel bit test mode.

Figure 3:
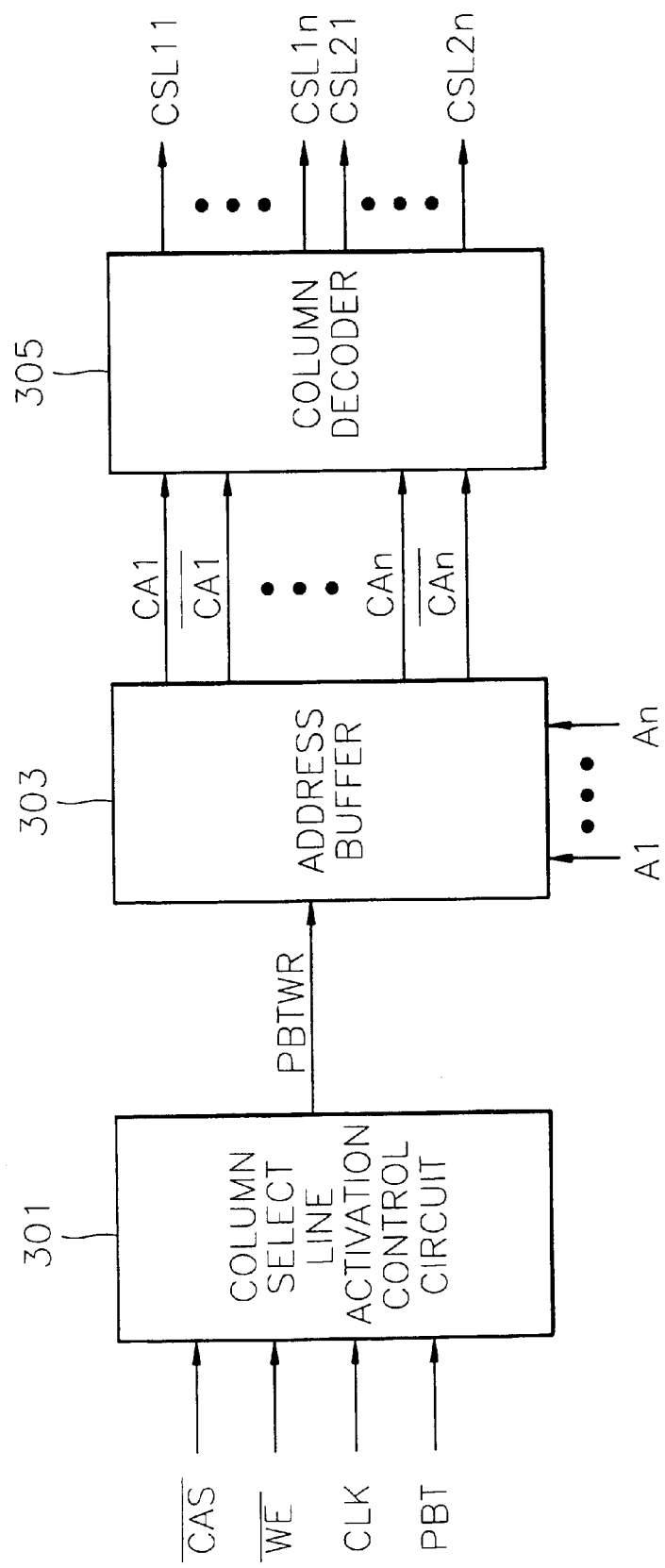
FIG. 3 is a block diagram of a preferred embodiment of a simultaneous column select line activation circuit shown in FIG. 2.

FIG. 3 is a block diagram of an embodiment of the simultaneous column select line activation circuit shown in FIG. 2. Referring to FIG. 3, the simultaneous column select line activation circuit includes a column select line activation control circuit 301, an address buffer 303, and a column decoder 305.

The column select line activation control circuit 301 logically combines a column address strobe signal $\overline{\text{CAS}}$, a write enable signal $\overline{\text{WE}}$, a clock CLK, and a test signal PBT (indicating the parallel bit test) and generates a control signal PBTWR that is activated during the write cycle of the parallel bit test mode. The address buffer 303 disregards at least one address bit of addresses A1 through An in response to the control signal PBTWR. The column decoder 305 simultaneously activates at least two of the column select lines CSL11 through CSL1n and CSL21 through CSL2n in response to the outputs CA1/$\overline{\text{CA1}}$, . . . , CAn/$\overline{\text{CAn}}$ of the address buffer.

For example, when n is 9 and the address buffer 303 is designed to disregard address bit A8, the address buffer 303 senses an address 000000000 to be the same as an address 000000010 and generates the same outputs for both. Therefore, when the address 000000000 is applied to the address buffer 303, the column decoder 305 simultaneously activates two column select lines corresponding to the address 000000000 and the address 00000010.

Figure 4:
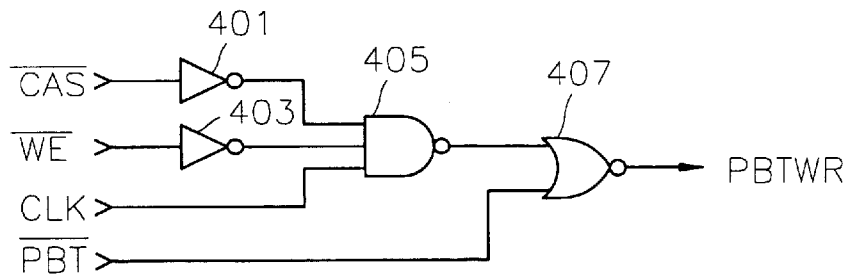
FIG. 4 is a circuit diagram of an embodiment of a column select line activation control circuit shown in FIG. 3.

FIG. 4 is a circuit diagram of an embodiment of the column select line activation control circuit shown in FIG. 3. Referring to FIG. 4, the column select line activation control circuit includes an inverter 401 for inverting the column address strobe signal $\overline{\text{CAS}}$, an inverter 403 for inverting the write enable signal $\overline{\text{WE}}$, a NAND gate 405 that receives the outputs of the inverters 401 and 403 and the clock CLK as inputs, and a NOR gate 407 for generating the control signal PBTWR by receiving the output of the NAND gate 405 and the test signal $\overline{\text{PBT}}$ as inputs.

The control signal PBTWR is activated to logic "high" during the write cycle of the parallel bit test mode. Specifically, when the column address strobe signal $\overline{\text{CAS}}$ is logic low, the write enable signal $\overline{\text{WE}}$ is logic low, the clock CLK is logic high, and the test signal $\overline{\text{PBT}}$ is logic low.

Figure 5:
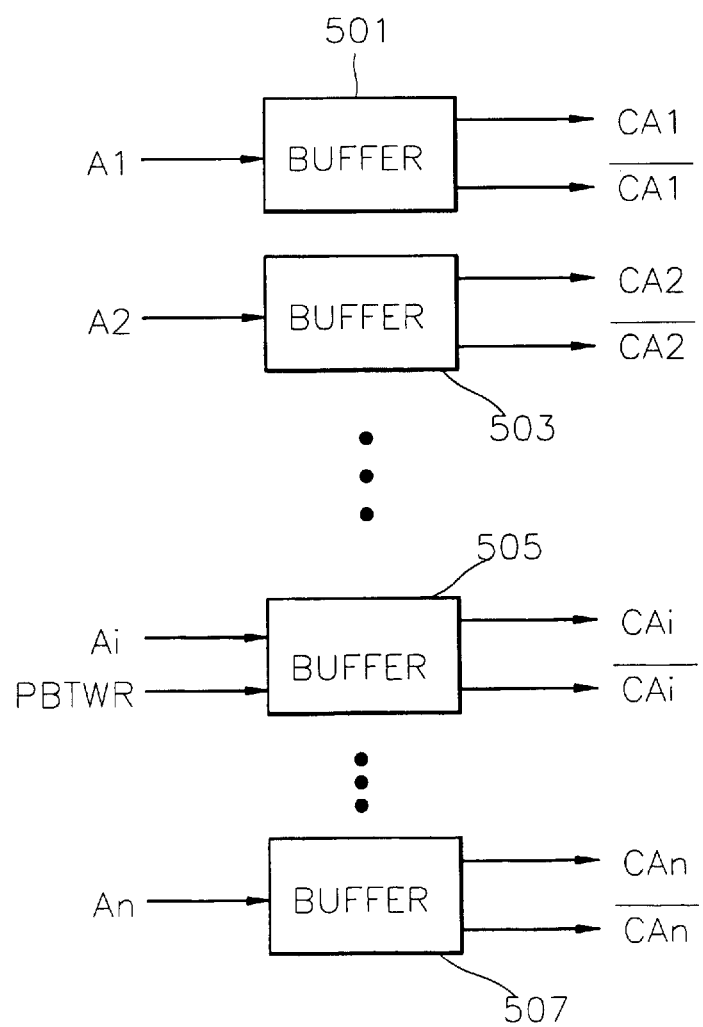
FIG. 5 is a block diagram of an embodiment of an address buffer shown in FIG. 3.

FIG. 5 is a block diagram of an embodiment of the address buffer shown in FIG. 3. Referring to FIG. 5, the address buffer includes buffers 501 through 507 for buffering the respective bits A1 through An of the external address and for generating the respective outputs CA1/$\overline{\text{CA1}}$, . . . , CAn/$\overline{\text{CAn}}$. In particular, the control signal PBTWR activated during the write cycle of the parallel bit test mode is applied to at least one among the buffers 503 through 507 with respect to the address bits. In FIG. 5, the control signal PBTWR is applied to the buffer 505 for buffering an address bit Ai.

Figure 6:
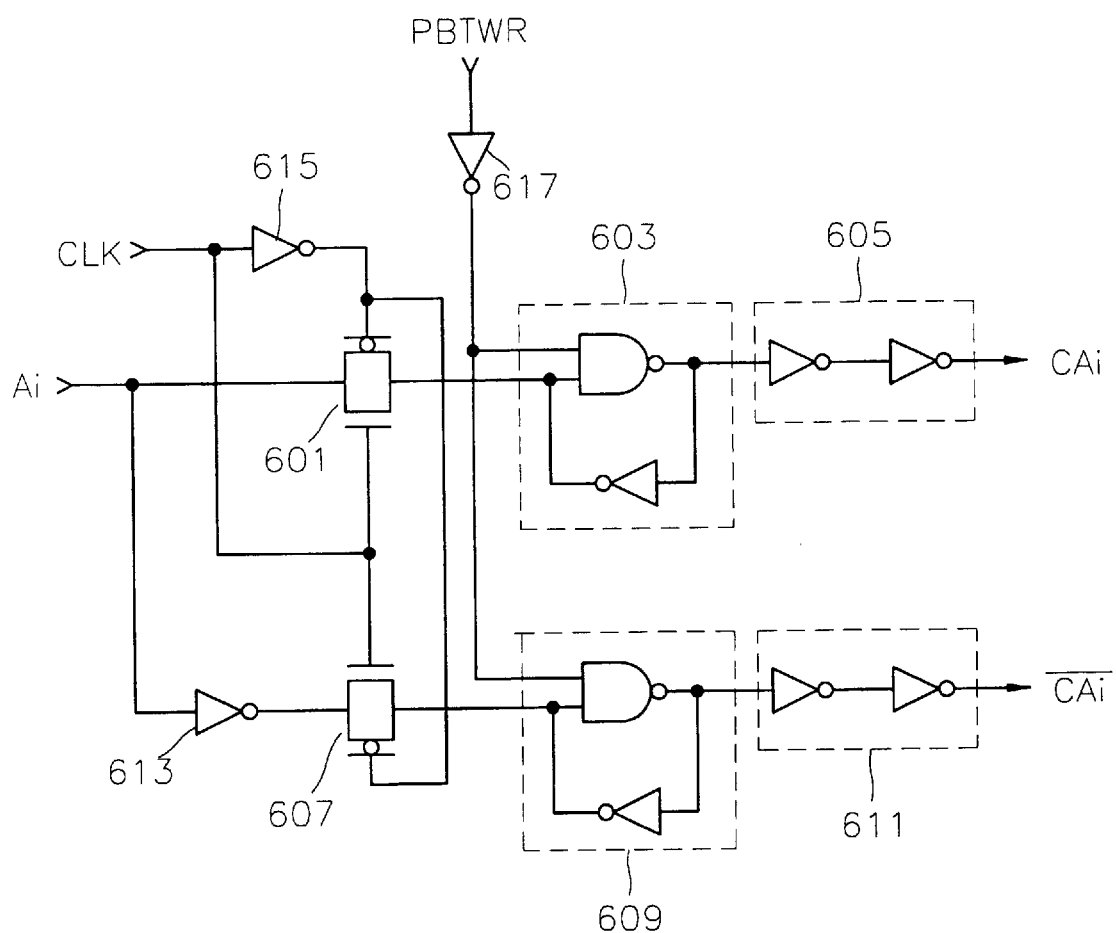
FIG. 6 is a circuit diagram of an embodiment of a buffer shown in FIG. 5.

FIG. 6 is a circuit diagram of an embodiment of the buffer shown in FIG. 5. Referring to FIG. 6, the buffer includes an inverter 617 for inverting the control signal PBTWR and a first transmission gate 601 for transferring the significant address bit Ai when the clock CLK is logic high. The buffer also includes a first latch 603 for latching the address bit Ai transmitted through the first transmission gate 601, in response to the output of the inverter 617, and a first driver 605 for receiving the output of the first latch 603 and generating an output CAi.

The buffer also includes an inverter 613 for inverting the address bit Ai and a second transmission gate 607 for transmitting the output of the inverter 613 when the clock CLK is logic high. The buffer also includes a second latch 609 for latching the output of the inverter 613 transmitted through the second transmission gate 607 in response to the output of the inverter 617, and a second driver 611 for receiving the output of the second latch 609 and generating an output $\overline{\text{CAi}}$.

Therefore, when the control signal PBTWR is deactivated to logic low, the inversion of the address bit Ai is output as CAi and the significant address bit Ai is output as $\overline{\text{CAi}}$. Thus, when the control signal PBTWR is deactivated to logic low, the buffer performs a normal operation. However, when the control signal PBTWR is activated to logic high during the write cycle of the parallel bit test mode, the output CAi and the output $\overline{\text{CAi}}$ are both logic high regardless of the address bit Ai. Thus, the address bit Ai is disregarded.

Accordingly, in memory devices and controlling methods according to the present invention write time can be reduced since at least two column select lines are simultaneously activated during the write cycle of the parallel bit test mode.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
    a memory cell array;
    a plurality of input and output lines;
    a plurality of column select lines that connect bit lines of the memory cell array to the input and output lines; and
    a simultaneous column select line activation circuit that simultaneously activates at least two of the plurality of column select lines during a write cycle of a parallel bit test mode, such that at least two of the bit lines corresponding to the at least two column select lines are connected to the same input and output line.

2. An integrated circuit memory device according to claim 1, wherein the simultaneous column select line activation circuit comprises:
    a column select line activation control circuit that generates a control signal during the write cycle of the parallel bit test mode;
    an address buffer that disregards at least one address bit in response to the control signal; and
    a column decoder that simultaneously activates at least two of the plurality of column select lines in response to the address buffer.

3. An integrated circuit memory device according to claim 2, wherein the column select line activation control circuit performs a logic combination of a test signal indicating the parallel bit test mode, a column address strobe signal, a write enable signal, and a clock, to generate the control signal.

4. An integrated circuit memory device, comprising:
    a memory cell array;
    a plurality of input and output lines;
    a plurality of column select lines that connect bit lines of the memory cell array to the input and output lines; and
    a column select line activation control circuit that controls at least two of the plurality of column select lines to be simultaneously activated during a write cycle of a parallel bit test mode, such that at least two of the bit lines corresponding to the at least two column select lines are connected to the same input and output line.

5. An integrated circuit memory device according to claim 4, further comprising:
    an address buffer that disregards at least one address bit in response to the column select line activation control circuit; and
    a column decoder that simultaneously activates at least two of the plurality of column select lines in response to the address buffer.

6. An integrated circuit memory device according to claim 4, wherein the column select line activation control circuit performs a logic combination of a column address strobe signal, a write enable signal, a clock, and a test signal indicating the parallel bit test mode.

7. A method for controlling a column select line of an integrated circuit memory device comprising a memory cell array, a plurality of input and output lines, and a plurality of column select lines that connect bit lines of the memory cell array to the input and output lines, the method comprising the step of:
    simultaneously activating at least two of the plurality of column select lines during a write cycle of a parallel bit test mode, such that at least two of the bit lines corresponding to the at least two column select lines are connected to the same input and output line.

8. A method according to claim 7, wherein the step of simultaneously activating at least two of the plurality of column select lines comprises the steps of:
    generating a control signal during the write cycle of the parallel bit test mode;
    disregarding at least one address bit when the control signal is activated; and
    simultaneously activating at least two of the plurality of column select lines when at least one of the address bits is disregarded.

9. A method according to claim 8, wherein the step of generating a control signal comprises the step of logically combining a column address strobe signal, a write enable signal, a clock, and a test signal indicating the parallel bit test mode.

10. An integrated circuit memory device, comprising:
    a memory cell array;
    a plurality of input and output lines;
    a plurality of column select lines that connect bit lines of the memory cell array to the input and output lines; and
    means for simultaneously activating at least two of the plurality of column select lines during a write cycle of a parallel bit test mode, such that at least two of the bit lines corresponding to the at least two column select lines are connected to the same input and output line.

11. An integrated circuit memory device according to claim 10, wherein the means for simultaneously activating comprises:
    means for generating a control signal during the write cycle of the parallel bit test mode;
    means for disregarding at least one address bit in response to the control signal; and
    means for simultaneously activating at least two of the plurality of column select lines in response to the outputs of the disregarding means.

12. An integrated circuit memory device according to claim 11, wherein the means for generating a control signal comprises means for logically combining a test signal indicating the parallel bit test mode, and column address strobe signal, a write enable signal, and a clock.

13. An integrated circuit memory device, comprising:
    a memory cell array;
    a plurality of input and out lines;
    a plurality of column select lines that connect bit lines of the memory cell array to the input and output lines; and
    means for controlling at least two of the plurality of column select lines to be simultaneously activated during a write cycle of a parallel bit test mode such that at least two of the bit lines corresponding to the at least two column select lines are connected to the same input and output line.

14. An integrated circuit memory device according to claim 13 further comprising:
    means for disregarding at least one address bit in response to the controlling means; and
    means for simultaneously activating at least two of the plurality of column select lines in response to the disregarding means.

15. An integrated circuit memory device according to claim 13, wherein the controlling means comprises means for logically combining a column address strobe signal, a write enable signal, a clock, and a test signal indicating the parallel bit test mode.

* * * * *